US008988928B2

(12) United States Patent
Lee

(10) Patent No.: US 8,988,928 B2
(45) Date of Patent: Mar. 24, 2015

(54) OPERATING METHOD OF A NONVOLATILE MEMORY DEVICE

(71) Applicant: Samsung Electronics Co., Ltd., Suwon-si, Gyeonggi-do (KR)

(72) Inventor: ChulHo Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 60 days.

(21) Appl. No.: 13/947,466

(22) Filed: Jul. 22, 2013

(65) Prior Publication Data

US 2014/0022832 A1 Jan. 23, 2014

(30) Foreign Application Priority Data

Jul. 23, 2012 (KR) .......................... 10-2012-0080187

(51) Int. Cl.
*G11C 7/00* (2006.01)
*G11C 13/00* (2006.01)
*G11C 11/56* (2006.01)

(52) U.S. Cl.
CPC ............ *G11C 13/0069* (2013.01); *G11C 11/56* (2013.01); *G11C 11/5678* (2013.01); *G11C 13/0064* (2013.01); *G11C 13/0002* (2013.01); *G11C 2213/72* (2013.01)
USPC ................. 365/148; 365/185.03; 365/189.011

(58) Field of Classification Search
CPC ........... G11C 13/0069; G11C 13/0007; G11C 13/0064; G11C 13/0004; G11C 13/0002; G11C 11/16; G11C 11/5685; G11C 2213/79; G11C 2213/72
USPC ............... 365/148, 158, 163, 189.07, 189.09, 365/189.011, 184, 230.04
See application file for complete search history.

(56) References Cited

U.S. PATENT DOCUMENTS

| 6,940,780 | B2 | 9/2005 | Chevallier | |
|---|---|---|---|---|
| 7,006,371 | B2* | 2/2006 | Matsuoka | 365/148 |
| 7,511,985 | B2* | 3/2009 | Horii et al. | 365/148 |
| 7,663,922 | B2 | 2/2010 | Park et al. | |
| 8,787,068 | B2* | 7/2014 | Seko et al. | 365/148 |
| 2010/0067279 | A1 | 3/2010 | Choi | |
| 2010/0226164 | A1* | 9/2010 | Nagashima et al. | 365/148 |
| 2011/0205789 | A1 | 8/2011 | Kim | |
| 2011/0321169 | A1 | 12/2011 | Cormode et al. | |
| 2011/0321177 | A1 | 12/2011 | Nishi et al. | |
| 2013/0314975 | A1* | 11/2013 | Katayama et al. | 365/148 |
| 2014/0112055 | A1* | 4/2014 | Kawahara et al. | 365/148 |

FOREIGN PATENT DOCUMENTS

JP 2008-52867 A 3/2008
KR 10-2011-0097097 A 8/2011

* cited by examiner

*Primary Examiner* — Gene Auduong
(74) *Attorney, Agent, or Firm* — Lee & Morse, P.C.

(57) ABSTRACT

An operating method of a multi-bit-per-cell nonvolatile memory device, e.g., first and second variable resistance memory cells connected to one of word lines. The operating method may include receiving first to fourth data sequentially, providing a first program current to the first variable resistance memory cell to program the first and second data to the first variable resistance memory cell, and providing a second program current to the second variable resistance memory cell to program the third and fourth data to the second variable resistance memory cell after verifying whether an actual resistance of the programmed first variable resistance memory cell is within an intended resistance distribution.

19 Claims, 7 Drawing Sheets

OPERATING METHOD OF A NONVOLATILE MEMORY DEVICE

CROSS-REFERENCE TO RELATED APPLICATIONS

The present application claims priority under 35 U.S.C. §119 to and benefit of Korean Patent Application No. 10-2012-0080187, filed on Jul. 23, 2012, in the Korean Intellectual Property Office, and entitled: "Operating Method of Nonvolatile Memory Device," which is incorporated by reference herein in its entirety.

BACKGROUND

1. Field

Example embodiments of the inventive concept relate to a semiconductor memory device, and in particular, to a multi-bit-per-cell nonvolatile memory device and an operating method thereof.

2. Description of the Related Art

Memory cells may be configured to store one or more bit data into each memory cell. A single-bit cell or single-level cell (SLC) refers to a type of memory cell configured to store one bit, while a multi-bit cell or multi-level cell (MLC) refers to a type of memory cell configured to store two or more bits. Recently, there have been many researches to improve memory device with multi-bit cells.

SUMMARY

Example embodiments of the inventive concept provide a method of operating a nonvolatile memory device configured to store multi-bit data.

According to example embodiments of the inventive concepts, a method of operating a nonvolatile memory device including first and second variable resistance memory cells connected to one of word lines may include receiving first to fourth data sequentially, providing a first program current to the first variable resistance memory cell to program the first and second data to the first variable resistance memory cell, and providing a second program current to the second variable resistance memory cell to program the third and fourth data to the second variable resistance memory cell after verifying whether an actual resistance of the programmed first variable resistance memory cell resides in an intended resistance distribution.

In example embodiments, the verifying of the actual resistance of the programmed first variable resistance memory cell may include varying the amount of first program current until the actual resistance of the programmed first variable resistance resides in the intended resistance distribution when the actual resistance of the first variable resistance memory cell does not reside within the intended resistance distribution; and providing the varied first program current the first variable resistance memory cell.

In example embodiments, the providing of the second program current may be performed when the actual resistance of the first variable resistance memory cell resides within the intended resistance distribution.

In example embodiments, the intended resistance distribution ranges from a first reference resistance to a second reference resistance.

In example embodiments, the varying the amount of first program current may include increasing the amount of first program current when the changed resistance of the first variable resistance memory cell is lower than the first reference resistance.

In example embodiments, the varying the amount of first program current may include decreasing the amount of first program current when the changed resistance of the first variable resistance memory cell is higher than the second reference resistance.

In example embodiments, the varying the amount of first program current may include increasing or decreasing the amount of the first program current in accordance with verification results, and the increasing or decreasing the amount of the first program current is repeated until the actual resistance of the first variable resistance memory cell resides within the intended resistance distribution.

In example embodiments, a magnitude of change for the varying of the amount of the first program current may gradually decrease or increase over a number of iterations In example embodiments, each of the first variable resistance memory cells may be programmed to have one of four different resistance distributions According to example embodiments of the inventive concepts, a method of operating a nonvolatile memory device including first and second variable resistance memory cells including m bit-level cells ("m" is a natural number) may include providing a first program current to the first variable resistance memory cell to program first to m-th data of an input data to the first variable resistance memory cell; and providing a second program current to the second variable resistance memory cell to program the (m+1)th to (2m)th data to the second variable resistance memory cell after verifying whether an actual resistance of the programmed first variable resistance memory cell resides in an intended resistance distribution.

In example embodiments, each of the first and second variable resistance memory cells may be programmed to have one of 2m different resistance distributions.

According to example embodiments of the inventive concepts, a method of method of operating a nonvolatile memory device including first and second variable resistance memory cells including m bit-level cells ("m" is a natural number), the method including classifying data into even data and odd data, writing first even data and first odd data to the first variable resistance memory cell, and writing second even data and second odd data to the second variable resistance memory cell after verifying writing of the first even data and the first odd data.

In example embodiments, writing the first even data and the first odd data may include providing a first program current to the first variable resistance memory cell to program the first even data and the first odd data to the first variable resistance memory cell, and writing the second even data and the second odd data includes providing a second program current to the second variable resistance memory cell to program the second even data and the second odd data to the second variable resistance memory cell.

In example embodiments, verifying writing may include comparing actually written data with input data, and when actually written data differs from the input data by more than a predetermined amount, altering writing parameters in accordance with the comparison, and writing the first even data and the first odd data to the first variable resistance memory cell using altered writing parameters.

In example embodiments, when actually written data differs from the input data by less than the predetermined amount, writing second even data and second odd data to the second variable resistance memory cell.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
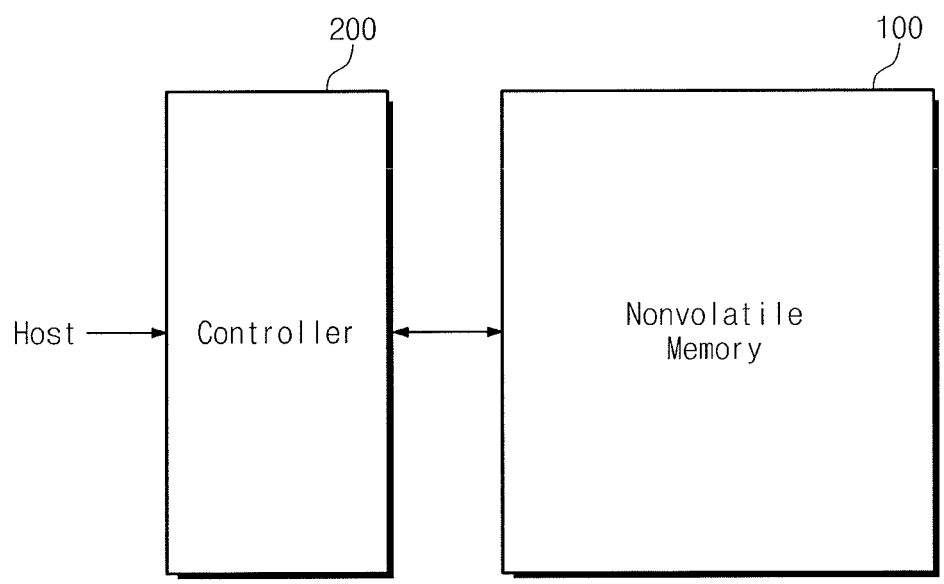
FIG. 1 illustrates a block diagram of a memory system including a nonvolatile memory device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 illustrates a block diagram of a memory system including a nonvolatile memory device according to example embodiments of the inventive concept. Referring to FIG. 1, a memory system according to example embodiments of the inventive concept may include a nonvolatile memory device 100 and a controller 200.

The nonvolatile memory device 100 may include a memory cell array and logic circuits, which may be configured to control operations of inputting or outputting data into or from memory cells in the memory cell array. A nonvolatile memory device according to example embodiments of the inventive concept will be described in more detail with reference to FIGS. 2 through 7.

The controller 200 may be configured to control read/write operation of the nonvolatile memory device 100 in response to read/write requests from a host.

The controller 200 may include a RAM, a processing unit, a host interface, and a memory interface. The RAM may be used as an operation memory of the processing unit. The processing unit may be configured to control an operation of the controller 200. The host interface may include protocol for exchanging data between the host and the controller 200. For example, the controller 200 may be configured to communicate with the outside (e.g., the host) via interface protocols (such as, Universal Serial Bus (USB), MMC, Peripheral Component Interconnect-Express (PCI-E), Advanced Technology Attachment (ATA), Serial-ATA, Parallel-ATA, Small Computer System Interface (SCSI), Enhanced Small Device Interface (ESDI), and Integrated Drive Electronics (IDE)).

The controller 200 and the nonvolatile memory device 100 may be integrated into one semiconductor device. For example, the controller 200 and the nonvolatile memory device 100 may constitute a single memory card. In addition, the controller 200 and the nonvolatile memory device 100 may be provided in the form of at least one of a PC card (e.g., PCMCIA), a compact FLASH card (e.g., CF), a smart media card (e.g., SM/SMC), a memory stick, a multimedia card (MMC, RS-MMC, and MMCmicro), a SD card (e.g., SD, miniSD, and microSD), or a universal FLASH storage (UFS).

In other example embodiments, the nonvolatile memory device 100 and the controller 200 may be provided in the form of a solid state disk (SSD).

Figure 2:
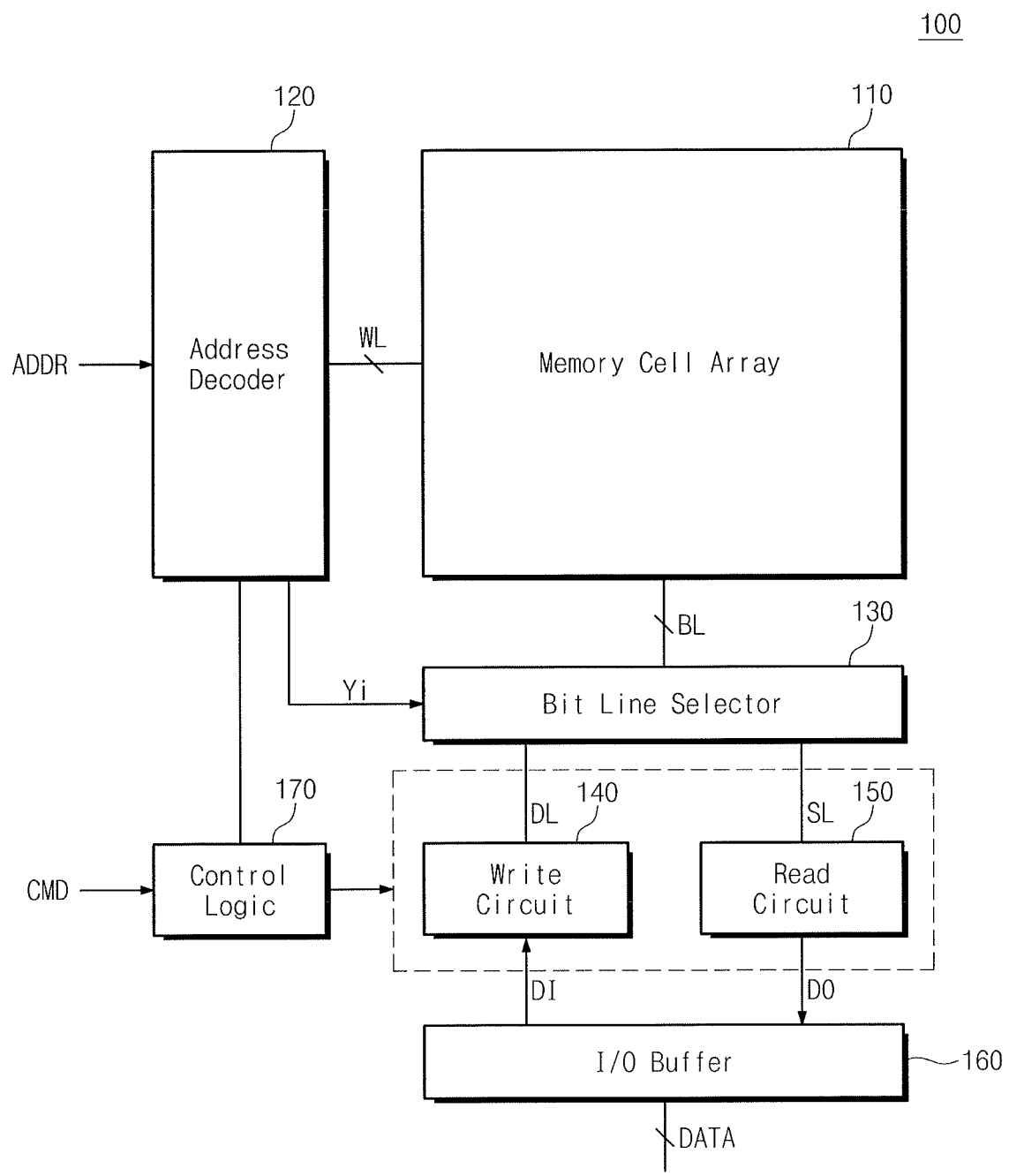
FIG. 2 illustrates a block diagram of a nonvolatile memory device according to example embodiments of the inventive concept.

FIG. 2 illustrates a block diagram of the nonvolatile memory device of FIG. 1. Referring to FIG. 2, the nonvolatile memory device according to example embodiments of the inventive concept may include a memory cell array 110, an address decoder 120, a bit line selector 130, a write circuit 140, a read circuit 150, an input/output (I/O) buffer 160, and a control logic 170.

The memory cell array 110 may include a plurality of word lines WL, a plurality of bit lines BL, and memory cells provided at intersections between the word lines WL and the bit lines BL. The memory cell array 110 will be described in more detail with reference to FIG. 3.

The address decoder 120 may be connected to the memory cell array 110 through the word lines WL. The address decoder 120 may decode an address ADDR, which is input from the outside, to select the word lines WL and the bit lines BL. The address ADDR may include a row address for selecting the word line WL and a column address for selecting the bit line BL. The address decoder 120 may generate a bit line selection signal Yi for selecting the bit line BL and provide the bit line selection signal Yi to the bit line selector 130.

The bit line selector 130 may be connected to the memory cell array 110 via the bit lines BL and be connected to the read and write circuits 140 and 150 via a data line DL and a sensing line SL. The bit line selector 130 may connect the bit line BL electrically to the data line DL or to the sensing line SL in response to the bit line selection signal Yi from the address decoder 120.

The write and read circuits 140 and 150 may be configured to write data DI to the memory cell array 110 or read out data DO from the memory cell array 110. For this, the data I/O circuit may include the write circuit 140 and the read circuit 150. The write and read circuits 140 and 150 may be configured to transfer data DATA input through the I/O buffer 160 to the write circuit 140 and the read circuit 150 via the data I/O lines DI and DO.

In a writing operation, the write circuit 140 may provide a program (or write) current to a selected bit line BL through the data line DL. For example, the write circuit 140 may receive a set or reset pulse from the control logic 170 and generate a set or reset current. The write circuit 140 may receive the data DATA from the I/O buffer 160 and provide the set or reset current to a selected global bit line BL. In addition, the write circuit 140 may be configured to control an amount of current to be supplied to the selected bit line BL, depending on a bias voltage DC_BIAS provided from the control logic 170. The write circuit 140 may be configured to provide the set current in response to the set pulse, when data '0' is input, and to provide the reset current in response to the reset pulse, when data '1' is input.

In a reading operation, the read circuit 150 may be configured to read out data DO from selected multi-bit cells through the sensing line SL. For example, during the reading operation, the read circuit 150 may be configured to supply a read current to the memory cell array 110 through the sensing line SL. During the reading operation, the read circuit 150 may compare a voltage obtained through the sensing line SL with a reference voltage to determine the data DO stored in the selected multi-bit cells. The data DO, which have been read from the read circuit 150, may be output to the outside through the I/O buffer 160.

The I/O buffer 160 may be configured to provide the data DATA from the outside to the write circuit 140 or the data DATA from the read circuit 150 to the outside.

Based on a command signal CMD from the outside, the control logic 170 may output control signals for controlling the nonvolatile memory device. In example embodiments, the control logic 170 may be configured to classify the column address input from the outside into even and odd column addresses, and to provide them to the write circuit 140. This will be described in more detail with reference to FIG. 5.

The control logic 170 may control operations to be performed in the write circuit 140 during the writing operation and operations to be performed in the read circuit 150 during the reading operation. For example, the control logic 170 may be configured to provide the set or reset pulse, which may be used for generating a program current during the writing operation, to the write circuit 140. In addition, the control logic 170 may be configured to provide the bias voltage DC_BIAS, which is used to control an amount of current to be supplied to the multi-bit cells, to the write circuit 140. Further, the control logic 170 may provide a reference voltage, which is compared with the voltage of the sensing line SL during the reading operation, to the read circuit 150. During the reading operation, the control logic 170 may be configured to control the address decoder 120 for selectively selecting ones of the word lines WL and the bit lines BL and to control the I/O buffer 160 for provisionally storing data from the memory cells to a corresponding part of the I/O buffer 160.

Figure 3:
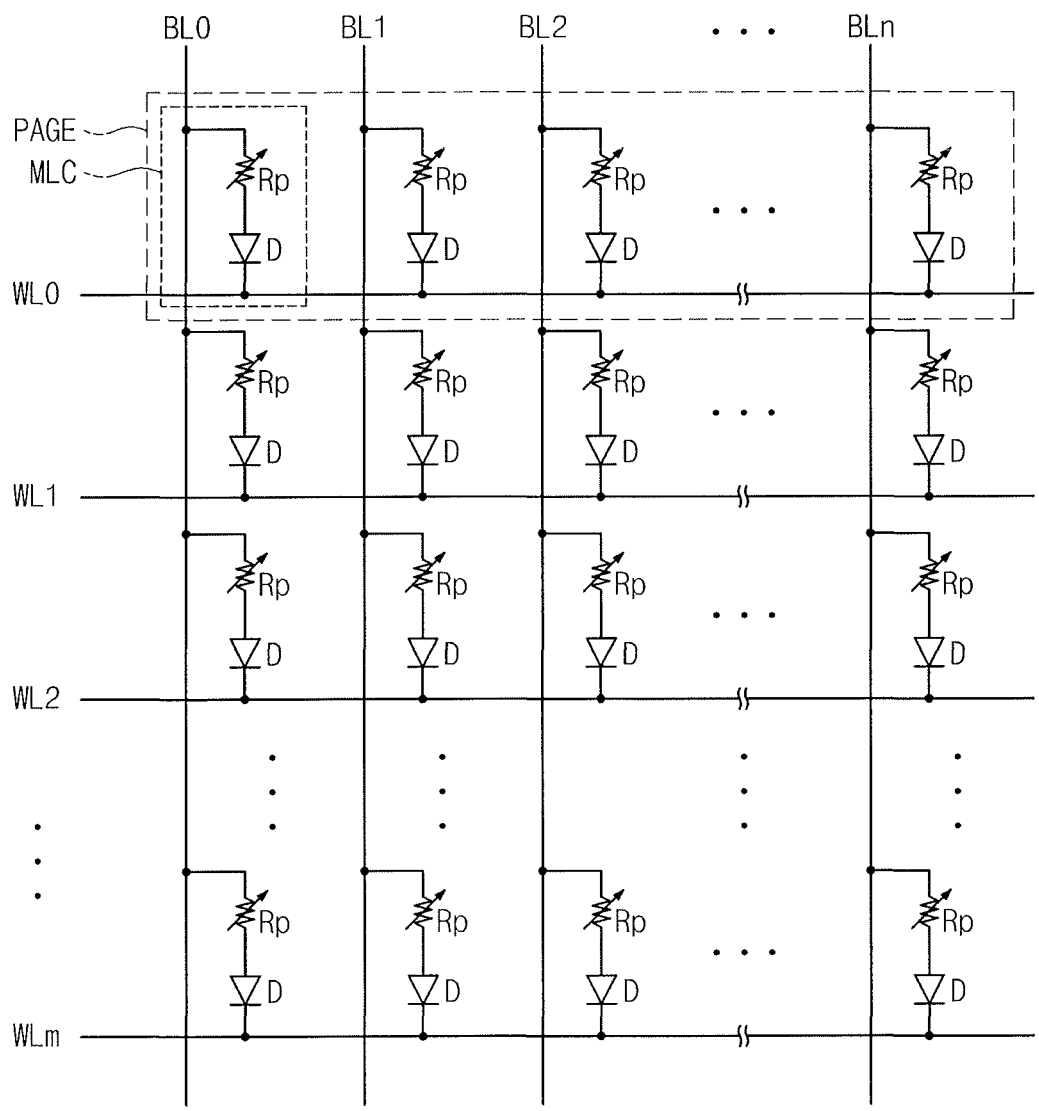
FIG. 3 illustrates a schematic circuit diagram of a cell array of a nonvolatile memory device according to example embodiments of the inventive concept.

FIG. 3 illustrates a schematic circuit diagram of a memory cell array of the nonvolatile memory device of FIG. 2. Referring to FIG. 3, the memory cell array 110 may include a plurality of word lines WL0-WLm, a plurality of bit lines BL0-BLn, and a plurality of memory cells MLC. The memory cells MLC may be provided at intersectional positions between the word lines WL0-WLm and the bit lines BL0-BLn.

In example embodiments, each of the memory cells MLC may include a memory device Rp and a selection device D. The memory device Rp may be provided between a corresponding one of the bit lines BL0-BLn and the selection device D, and the selection device D may be provided between the memory device Rp and a corresponding one of the word lines WL0-WLm.

In example embodiments, the memory device Rp may be a variable resistance device, whose resistance can be switched into one of a plurality of levels using an electric pulse applied thereto. For example, the variable resistance device may be a phase-changeable material, whose crystal structure can be changed depending on an amount of current applied thereto. The phase-changeable material may be one of binary compounds (e.g., GaSb, InSb, InSe, $Sb_2Te_3$, or GeTe), trinary compounds (e.g., GeSbTe, GaSeTe, InSbTe, $SnSb_2Te_4$, InSbGe), four components compounds (e.g., AgInSbTe, (GeSn) SbTe, GeSb(SeTe), or $Te_{81}Ge_{15}Sb_2S_2$), and so forth.

The phase-changeable material may have two different crystalline structures: 1) an amorphous structure of high resistance and 2) a crystal structure of low resistance. The crystalline structure of the phase-changeable material may be changed by Joule's heat that is generated depending on an amount of supplied current, and this phase change in crystalline structure of the phase-changeable material may be used as a data storing mechanism.

In other example embodiments, the memory device Rp may be a variable resistance device realized using at least one of perovskite compounds, transition metal oxides, magnetic materials, ferromagnetic materials, or antiferromagnetic materials.

The selection device D may be configured to control a flow of current passing through the memory device Rp, depending on voltage difference between the corresponding one of the word lines WL0-WLm and the corresponding one of the bit lines BL0-BLn.

In example embodiments, the selection device D may be provided in the form of PN- or PIN junction diode, whose anode and cathode are connected to the memory device Rp and the corresponding one of the word lines WL0-WLm, respectively. In this case, in the case where a voltage difference between the anode and the cathode is higher than a threshold voltage of the diode, a current path may be formed to pass through the memory device Rp. In other example embodiments, the selection device D may be provided in the form of MOS transistor. For example, the selection device D may be an NMOS transistor using the corresponding one of the word line WL0-WLm as a gate electrode thereof. In this case, a current path passing through the memory device Rp may be formed depending on a voltage applied to the word line WL. In still other example embodiments, the selection device D may be provided in the form of a PNP or NPN bipolar transistor BJT.

Figure 4:
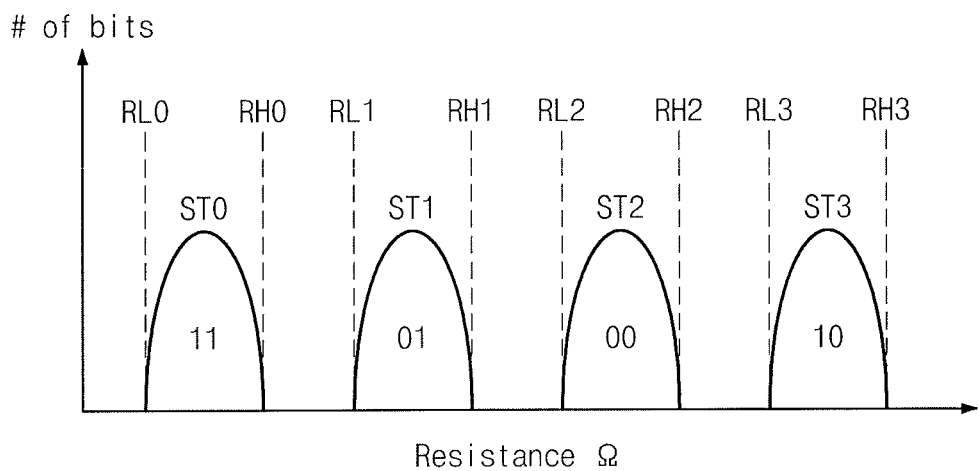
FIG. 4 illustrates a diagram of resistance distributions of a multi-level memory cell of a nonvolatile memory device according to example embodiments of the inventive concept.

FIG. 4 illustrates a diagram of resistance distributions of a multi-level memory cell of a nonvolatile memory device according to example embodiments of the inventive concept.

In example embodiments, each of the memory cells may include a variable resistance device (e.g., of the phase-changeable material) configured to store $2^N$ bit (where N is a natural number).

For example, in the case where each memory cell is configured to store two bits of data, the variable resistance device may have four ($=2^2$) different distributions of resistance. Thus, as shown in FIG. 4, the memory cells of a nonvolatile memory device may have first, second, third, and fourth resistance distributions ST0, ST1, ST2, and ST3. Each memory cell may be programmed to have one of the four resistance distributions. Also, the resistance distributions of the variable resistance device may be determined by controlling a size of the amorphous portion in the phase-changeable material. The larger the size of the amorphous portion, the higher an electric resistance of the phase-changeable material.

In example embodiments, the first resistance distribution ST0 corresponds to the case that the phase-changeable material has the lowest resistance level or the smallest amorphous portion, while the fourth resistance distribution ST3 corresponds to the case that the phase-changeable material has the highest resistance level or the largest amorphous portion. The second resistance distribution ST1 corresponds to the case that the phase-changeable material has a resistance level that is higher than the first resistance distribution ST0 and lower than the third resistance distribution ST2, and the third resistance distribution ST2 corresponds to the case that thee phase-changeable material has a resistance level that is higher than the second resistance distribution ST1 and lower than the fourth resistance distribution ST3. The first resistance distribution ST0 may be higher than a first reference resistance RL0 and lower than a second reference resistance RH0. The second resistance distribution ST1 may be higher than a third reference resistance RL1 and lower than a fourth reference resistance RH1. The third resistance distribution ST2 may be higher than a fifth reference resistance RL2 and lower than a sixth reference resistance RH2. The fourth resistance distribution ST3 may be higher than a seventh reference resistance RL3 and lower than an eighth reference resistance RH3.

To secure a read margin, the resistance distributions ST0, ST1, ST2, and ST3 may be configured to not overlap with each other. Each of the resistance distributions ST0, ST1, ST2, and ST3 may be referred as to one of 00 data, 01 data, 10 data, and 11 data. In example embodiments, the resistance level may increase in the sequence of 11 data, 01 data, 00 data, and 10 data. For example, the first resistance distribution ST0 may correspond to the 11 data, the second resistance distribution ST1 may correspond to the 01 data, the third resistance distribution ST2 may correspond to the 00 data, and the fourth resistance distribution ST3 may correspond to the 10 data.

Figure 5:
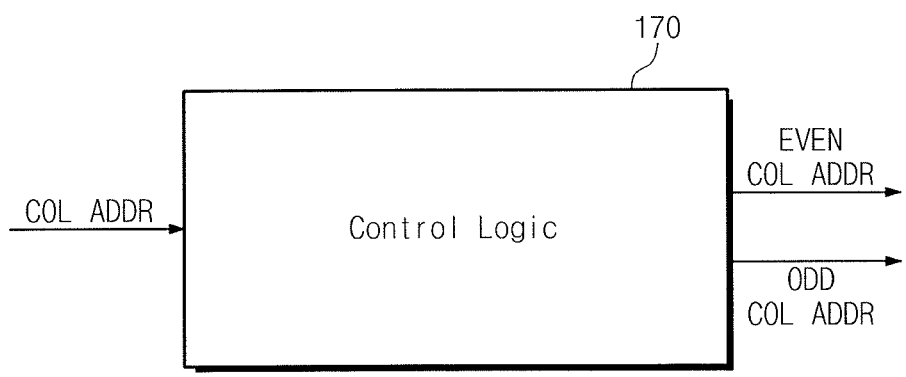
FIG. 5 illustrates a block diagram illustrating a control logic of a nonvolatile memory device according to example embodiments of the inventive concept.

FIG. 5 illustrates a block diagram illustrating a control logic of the nonvolatile memory device of FIG. 2.

Referring to FIG. 5, the control logic 170 may be configured to decode a column address COL ADDR and output an even column address EVEN COL ADDR and an odd column address ODD COL ADDR. For example, the control logic 170 may classify the column address COL ADDR into the even column address EVEN COL ADDR and the odd column address ODD COL ADDR according to an input sequence of COL ADDR, and output the classified even and odd column addresses EVEN COL ADDR and ODD COL ADDR in an alternating manner. In example embodiments, a pair of the even and odd column addresses EVEN COL ADDR and ODD COL ADDR may be allocated to the same memory cell.

Furthermore, the control logic 170 may be configured to classify the data DQ input through the I/O buffer 160 into even and odd data EVEN DQ and ODD DQ, and to store even and odd data EVEN DQ and ODD DQ in each memory cells.

Figure 6:
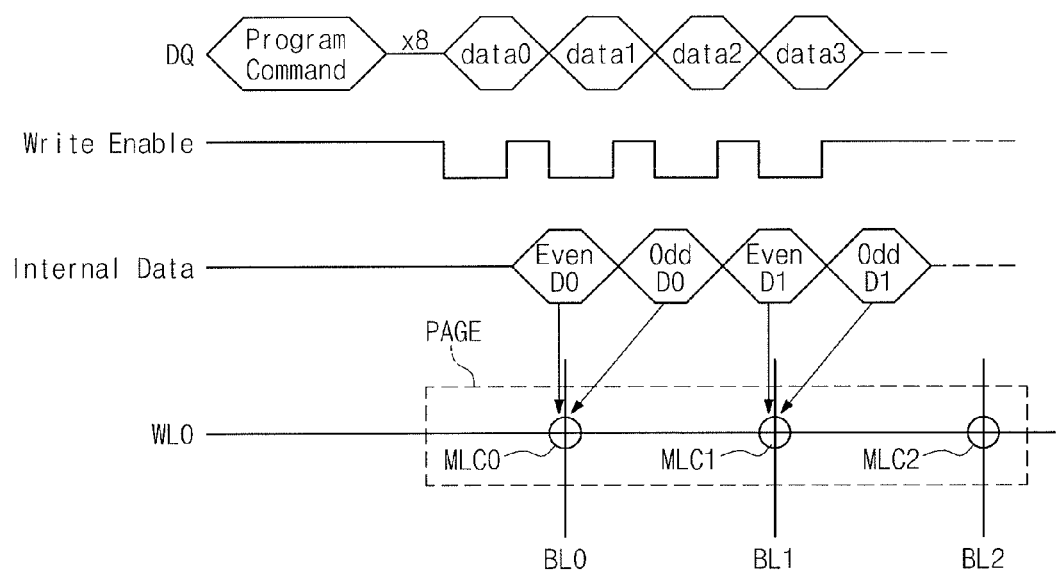
FIG. 6 illustrates a diagram of a programming operation performed in a nonvolatile memory device according to example embodiments of the inventive concept.

FIG. 6 illustrates a diagram of a programming operation performed in a nonvolatile memory device according to example embodiments of the inventive concept.

In example embodiments, memory cells MLC0, MLC1, and MLC2 connected to each of the word lines (e.g., WL0) may constitute a page in a physical aspect of hierarchical structure of data. In the case where two bits of data are stored in each of the memory cells MLC0, MLC1, and MLC2, the memory cells MLC0, MLC1, and MLC2 may constitute two pages in a logical aspect. In other words, one physical page may be used to realize two logical pages. Furthermore, in the case where n-bit data is stored in each memory cell, a size of a logical page may be n-times a size of its physical page.

For example, referring to FIGS. 5 and 6, two bits of the even and odd data EVEN DQ and ODD DQ may be stored in each of the memory cells MLC0, MLC1, and MLC2. The even and odd column addresses EVEN COL ADDR and ODD COL ADDR, which may be output from the control circuit 170, may be allocated to each of the memory cells MLC0, MLC1, and MLC2. For example, in each memory cell MLC, the even data EVEN DQ may be stored by the even column address EVEN COL ADDR, and the odd data ODD DQ may be stored by the odd column address ODD COL ADDR.

In example embodiments, eight bits of data to be input to the nonvolatile memory device may be synchronized with a write enable signal to sequentially perform a writing operation in a unit of two bits to the memory cells MLC0, MLC1, and MLC2. Two bits of data may be stored in each memory cell that is allocated by the odd and even column addresses EVEN COL ADDR and ODD COL ADDR. For example, first ones of the even and odd column addresses may be allocated to the first memory cell MLC0, and second ones of the even and odd column addresses may be allocated to the second memory cell MLC 1.

Furthermore, as described with reference to FIG. 2, the control logic 170 may be configured to classify the data DQ input through the I/O buffer 160 into the even and odd data EVEN DQ and ODD DQ, and to store them, respectively. The write circuit may be configured to output the even and odd data EVEN DQ and ODD DQ through even and odd data lines (not shown), respectively. For example, the even and odd data EVEN DQ and ODD DQ may be input into the memory cell array through different data-input paths from each other, and be synchronized with the write enable signal to be stored into each of the memory cells MLC0, MLC1, and MLC2. The even data EVEN DQ may be written into the memory cell MLC by the even column address EVEN COL ADDR, and the odd data ODD DQ may be written into the memory cell by odd column address.

For example, when "data 0", "data 1", "data 2", and "data 3" as the input data DQ are sequentially input, the "data 0" may be designated the first EVEN DQ(Even DO) and the "data 1" may be designated the first ODD DQ(Odd DO). Then, the "data 2" may be designated the second EVEN DQ(Even D1) and the "data 3" may be designated the second ODD DQ(Odd D1). The even and odd data EVEN DQ and ODD DQ may be written to each of the memory cells MLC0, MLC1, and MLC2 in a sequential manner. For example, the first even data EVEN DO and the first odd data ODD DO may be sequentially written to the first memory cell MLC0. Next, the second even data EVEN D1 and the second odd data ODD D1 may be sequentially written to the second memory cell MLC 1. The third even data EVEN D2 and the third odd data ODD D2 may be sequentially written to the third memory cell MLC2. The fourth even data EVEN D3 and the fourth odd data ODD D3 may be sequentially written to the fourth memory cell MLC3, and so forth.

As described above, the data DQ input through the I/O buffer 160 may be classified into the even and odd data EVEN DQ and ODD DQ, and the even and odd data EVEN DQ and ODD DQ may be sequentially written into each of the memory cells MLC0, MLC1, and MLC2. Accordingly, it is possible to perform an operation of writing multi-bit data to the memory cells MLC0, MLC1, and MLC2 through a single step of providing a program current. As a result, it is possible to realize multi-bit programming of the nonvolatile memory device, without classifying a page into LSB and MSB.

So far, the example of the example embodiments, in which two-bits of data are stored into each memory cell in an input sequence, has been described. However, in certain embodiments, n-bits of data may be stored into each memory cell in an input sequence. For example, first to n-th data may be sequentially input through the I/O buffer 160 (where n is a natural number greater than one), the first to n-th data may be written into the first memory cell MLC0 by supplying a program current. As the result of writing the first to n-th data, resistance of the first memory cell MLC0 may be changed to be in one of $2^n$ resistance distributions.

Figure 7:
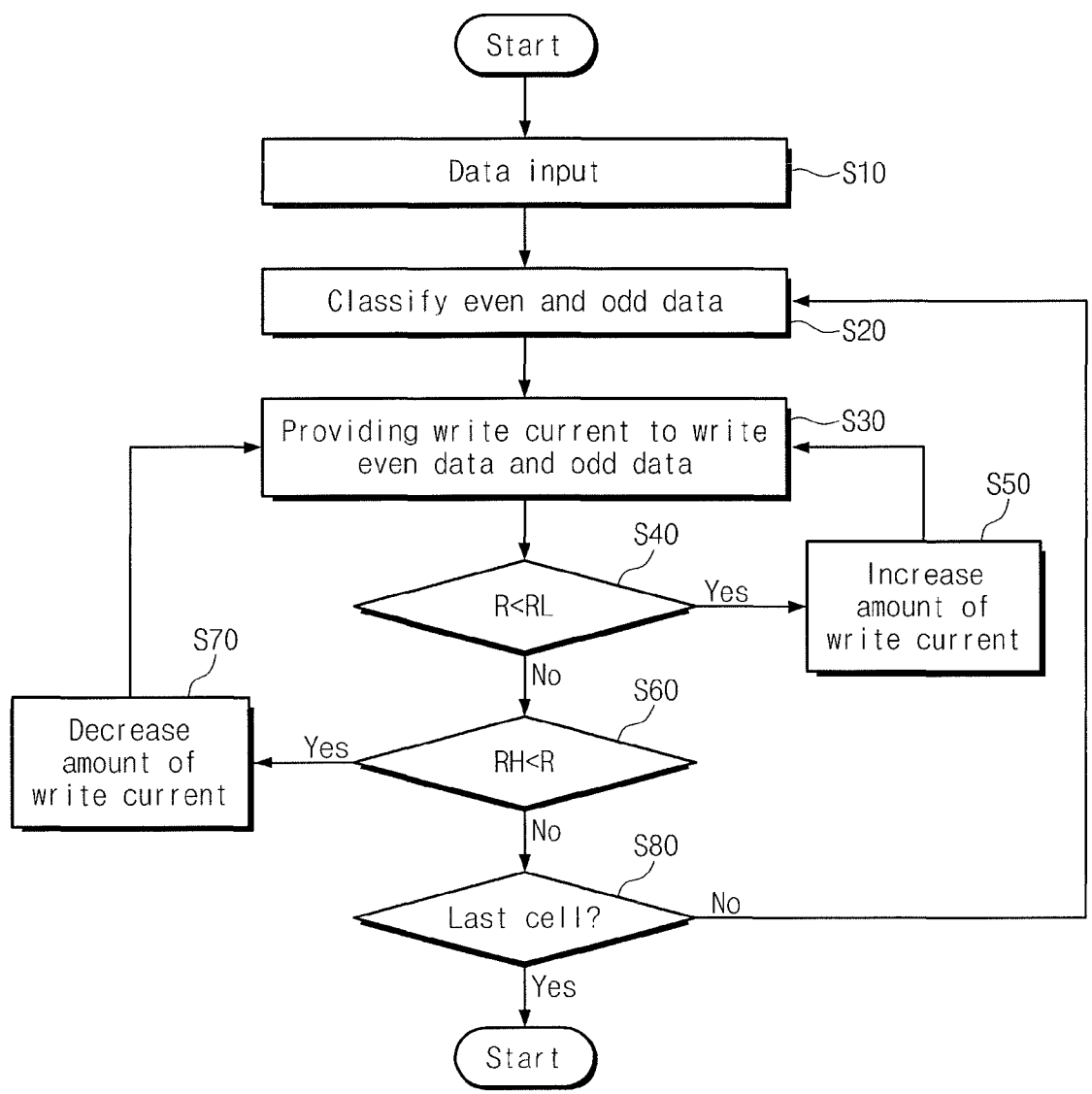
FIG. 7 illustrates a flow chart of a programming operation performed in a nonvolatile memory device according to other example embodiments of the inventive concept.

FIG. 7 illustrates a flow chart of a programming operation performed in a nonvolatile memory device according to other example embodiments of the inventive concept.

In other example embodiments, data input into the nonvolatile memory device may be sequentially stored into the memory cell in a unit of two bits, and a write-verifying operation may be performed after such a data writing operation to each memory cell. The write-verifying operation may be performed to examine whether resistance of the memory cell is in a range of resistance distribution corresponding to the written data. The write-verifying operation may be performed after every data writing operation to each memory cell. For example, in the case where two bits of data are written, the write-verifying operation may be performed after an operation of writing two bits of data. Then, an amount of write current may be decreased or increased, depending on the result of the write-verifying operation.

In detail, as shown in FIG. 7, n-bits (e.g., 8 bits) of data may be input through the I/O buffer 160 (in S10). The input data may be classified into the odd and odd data EVEN DQ and ODD DQ, as described with reference to FIG. 5 (in S20).

Thereafter, to perform a writing operation in the unit of page, a two-bits-data writing operation and a write-verifying operation may be repeatedly executed. For example, this may include writing first even and odd data into a first memory cell, verifying data stored in the first memory cell, writing second even and odd data into a second memory cell, verifying data stored in the second memory cell, writing third even and odd data into a third memory cell, verifying data stored in the third memory cell, writing fourth even and odd data into a fourth memory cell, and verifying data stored in the fourth memory cell.

The even data EVEN DQ and the odd data ODD DQ may be written into each of the memory cells (in S30). A current amount and a reference resistance RH or RL to be provided to a memory cell may be changed or selected depending on data to be written therein. For example, first even and odd data may be sequentially written into the first memory cell. Here, for the sake of simplicity, the description that follows will refer to an example of the present embodiment in which a '01' data is written into the first memory cell by the even data EVEN DQ and the odd data ODD DQ. In other words, for the '01' data, the third reference resistance RL1 and the fourth reference resistance RH1 may be selected as the reference resistance.

A write current corresponding to the even data EVEN DQ and the odd data ODD DQ may be supplied to the first memory cell to change resistance R of the first memory cell (in S30). Electric characteristics of the write current to be supplied to the first memory cell may be changed depending on data to be written to the memory cell. For example, in the case where data of "01" is written, an amount of the write current to be supplied for this writing may be controlled to maintain a constant level, to have a stage gradually decreasing from a predetermined level, or to have a stage gradually increasing from a predetermined level and then gradually decreasing. However, example embodiments of the inventive concepts are not limited thereto.

Thereafter, a write-verifying operation may be performed to examine whether the changed resistance R of the memory cell is in a range of the corresponding resistance distribution (in S40 and S60). For example, during the write-verifying operation, the memory cell may be examined to determine whether its resistance R is higher than the third reference resistance RL1 and lower than the fourth reference resistance RH1. If the resistance R is lower than the third reference resistance RL1 or higher than the fourth reference resistance RH1, a current, which is increased or decreased compared with that previously applied, is applied to the memory cell to change the resistance of the memory cell (in S50 and S70). The write-verifying operation may be repeated until the resistance R of the memory cell falls within a range of an intended resistance distribution. In example embodiments, as the number of repetitions increases, a change in amount of the write current may be increased or decreased. By repeating the write-verifying operation, two bits of data may be written in the memory cell with improved accuracy.

Hereinafter, a method of examining whether the resistance R changed by the write current falls within a range of intended resistance distribution will be exemplarily described with reference to the case where "01" data or the second resistance distribution ST1 is assumed as the intended resistance distribution. For this, the changed resistance R is compared with the third reference resistance RL1 (in S40).

If the changed resistance R is lower than the third reference resistance RL1, an increased current may be again applied to the memory cell to increase the resistance R of the memory cell (in S50). Then, an adjusted write current may be supplied to the first memory cell. For example, the adjusted write current may be increased by increasing amplitude or pulse duration thereof, compared with that previously applied.

If the changed resistance R is higher than the third reference resistance RL1, the changed resistance R is then compared with the fourth reference resistance RH1 (in S60). If the resistance R of the memory cell is higher than the fourth reference resistance RH1 (in S70), a decreased write current may be again applied to the memory cell to decrease the resistance R of the memory cell (in S30). The write current may be decreased by decreasing amplitude or pulse duration thereof, compared with that previously applied.

If the resistance of the memory cell falls within a range of an intended resistance distribution, e.g., through the above operations of minutely changing the resistance R, it may be examined whether the memory cell under examination is the last cell (in S80). If the memory cell under examination is not the last cell, the above operations from S20 to S80 may be repeatedly performed to a next one of the memory cells. For example, a write current may be applied to the second memory cell to write sequentially the second even and odd data to the second memory cell. Thereafter, the write-verifying operation may be performed to the second memory cell. For example, the second memory cell may be written, based on the second even and odd data, to have one of "00", "01", "10", and "11" data, and in this case, a lowest reference resistance RL and a highest reference resistance RH may be selected depending on the data to be written into the second memory cell. Thereafter, the write-verifying operation on the second memory cell may be performed in the same manner as that for the first memory cell.

Figure 8:
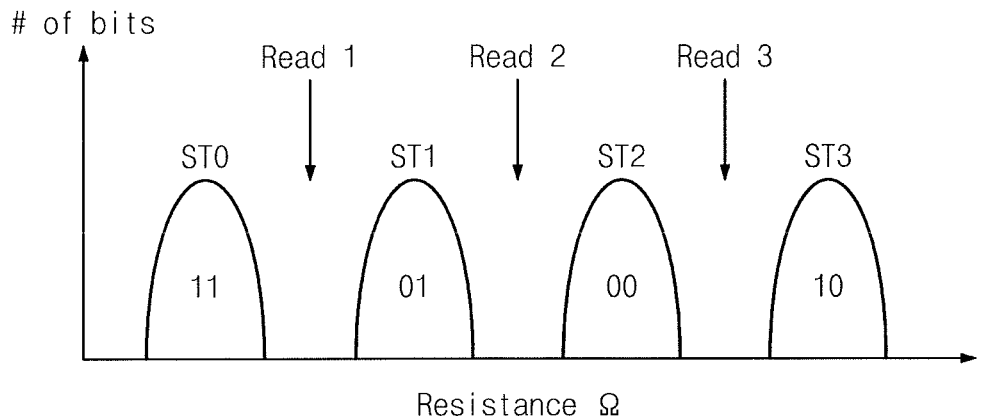
FIG. 8 illustrates a diagram of a reading operation performed in a nonvolatile memory device according to example embodiments of the inventive concept.

FIG. 8 illustrates a diagram of a reading operation performed in a nonvolatile memory device according to example embodiments of the inventive concept.

According to example embodiments of the inventive concept, since two bits of data are stored into each memory cell in an input sequence of data, a reading operation may be performed without an additional operation to examine whether the written data are LSB-programmed data or MSB-programmed data. In example embodiments, the data reading operation may be performed in order of levels of the resistance distributions.

For example, referring to FIGS. 2 and 8, during the reading operation triggered by a read command from the outside, the bit lines BL of the memory cells MLC may be pre-charged and the selected word line WL may be activated. Data of the memory cells MLC connected to the selected word line WL may be sensed as changes in electric potential of the precharged bit line BL. The read circuit 150 may sense a variation in voltage of the bit lines BL.

To read out electrical resistances of the memory cells MLC, the read circuit 150 may provide first to third read biases Read1, Read2, and Read3 to the memory cell MLC.

Here, the first to third read biases Read1, Read2, and Read3 may be selected to have different magnitudes from each other. In example embodiments, considering a sensing margin between the resistance distributions, the first to third read biases Read1, Read2, and Read3 may be selected to have sequentially increasing magnitudes.

For example, the first read bias Read1 may be applied to the memory cell MLC to examine whether or not the written data can be included within a range of "11" data. Next, the second read bias Read2 may be applied to the memory cell MLC to examine whether the written data can be included within a range of "11" and "01" data or within a range of "00" and "10" data. Thereafter, the third read bias Read3 may be applied to the memory cell MLC to examine whether or not the written data can be included within a range of "10" data. Two bits of data can be read out from the memory cell MLC by sequentially applying the first to third read biases Read1, Read2, and Read3 to the memory cell MLC. In other words, two bits of data may be read out from the memory cell MLC, without performing an additional operation to examine whether the written data are LSB-programmed data or MSB-programmed data. Accordingly, it is possible to realize the nonvolatile memory device with improved read performance.

Figure 9:
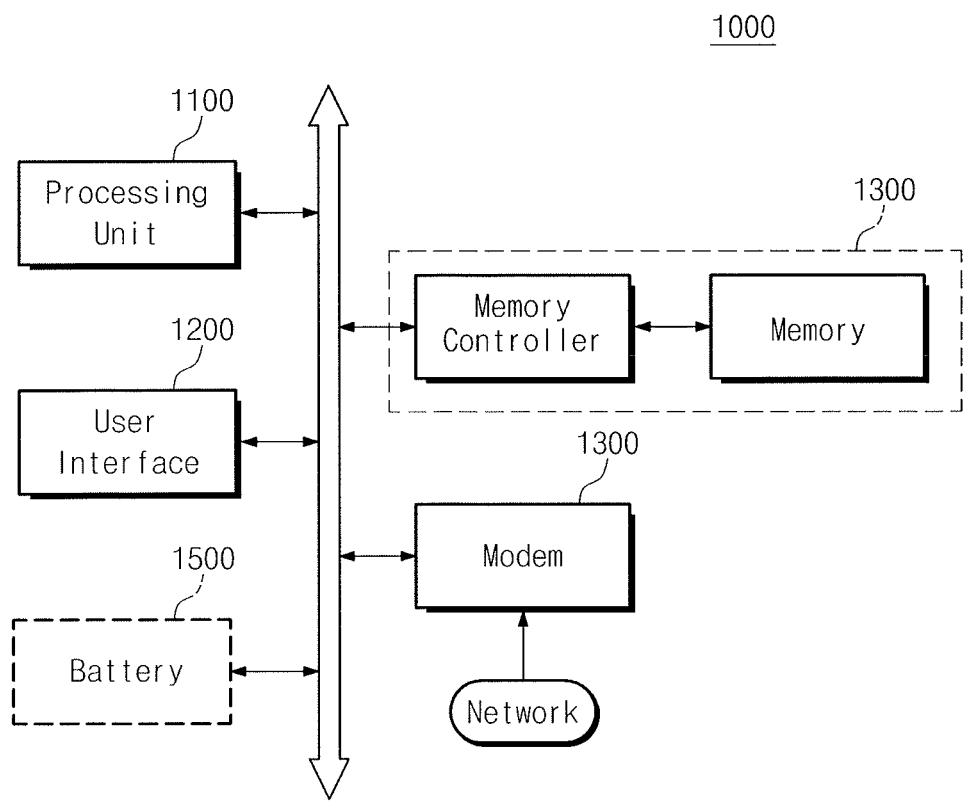
FIG. 9 illustrates a block diagram of an example of user devices, to which a nonvolatile memory device according to example embodiments of the inventive concept can be applied.

FIG. 9 illustrates a block diagram schematically of an example of user devices, to which a nonvolatile memory device according to example embodiments of the inventive concept can be applied. Referring to FIG. 9, a user device 1000 according to example embodiments of the inventive concept may include a micro-processor 1100, a user interface 1200, a modem 1300 (e.g., a baseband chipset), and a memory system 1400. The memory system 1400 may be configured to include at least one of the nonvolatile memory devices according to example embodiments of the inventive concept.

In the case where the user device 1000 is provided for the mobile application, the user device 1000 may further include a battery 1500. Further, although not shown, the user device 1000 may further include other electronic components, such as an application chipset and a Camera Image Processor (CIS), as will be obvious to skilled persons in the art.

According to example embodiments, during an operating of nonvolatile memory device, a column address may be classified into an even column address and an odd column address to store data in a unit of two bits in an input sequence of data. Accordingly, a multi-bit data can be programmed into a memory cell during one period of the write enable signal. This means that it is possible to increase a size of page that can be programmed by a single operation, and consequently, to improve performance of the multi-bit nonvolatile memory device.

In contrast, conventionally, when data to be stored in a 2-bit memory cell is classified into an MSB data page (or upper data page) and a LSB data page (or lower data page), to read out each data page, a flag cell should be firstly read to determine whether it is in a LSB Program state or a MSB Program state, and then, a read level will be applied thereto, leading to an increase in the number of reading steps and deterioration in performance.

Since a multi-bit data writing operation according to example embodiments can be performed by supplying a program current one time, it is possible to reduce a risk of data loss, which may occur when a power is interrupted during the writing operation.

In contrast, conventionally, the number of cells to which an operation can be simultaneously performed is limited due to power consumption. Where the MSB data page is programmed, a sudden Power Off may lead to data loss in LSB data page. Accordingly, a buffer is used or a portion of the memory is configured to function as a SLC (Single Level Cell). However, these alternatives lead increase cost and decrease performance.

Furthermore, since the data is sequentially stored into the memory cells according to example embodiments, it is possible to reduce an operation time required to perform a write-verifying operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of operating a nonvolatile memory device including first and second variable resistance memory cells connected to one of word lines, the method comprising:
   receiving first to fourth data sequentially;
   providing a first program current to the first variable resistance memory cell to program the first and second data to the first variable resistance memory cell; and
   providing a second program current to the second variable resistance memory cell to program the third and fourth data to the second variable resistance memory cell after verifying whether an actual resistance of the programmed first variable resistance memory cell resides in an intended resistance distribution.

2. The method as claimed in claim 1, wherein verifying the actual resistance of the programmed first variable resistance memory cell includes:
   varying the amount of the first program current until the actual resistance of the programmed first variable resistance resides in the intended resistance distribution when the actual resistance of the first variable resistance memory cell is not within the intended resistance distribution; and
   providing the varied first program current to the first variable resistance memory cell.

3. The method as claimed in claim 2, wherein providing the second program current is performed when the actual resistance of the first variable resistance memory cell resides within the intended resistance distribution.

4. The method as claimed in claim 2, wherein the intended resistance distribution ranges from a first reference resistance to a second reference resistance.

5. The method as claimed in claim 4, wherein varying the amount of the first program current includes increasing the amount of first program current when the changed resistance of the first variable resistance memory cell is lower than the first reference resistance.

6. The method as claimed in claim 4, wherein varying the amount of the first program current includes decreasing the amount of first program current when the changed resistance of the first variable resistance memory cell is higher than the second reference resistance.

7. The method as claimed in claim 1, wherein varying the amount of first program current includes increasing or decreasing the amount of the first program current in accordance with verification results, and increasing or decreasing the amount of the first program current is repeated until the actual resistance of the first variable resistance memory cell is within the intended resistance distribution.

8. The method as claimed in claim 7, wherein a magnitude of change for varying the amount of the first program current gradually decreases or increases over a number of iterations.

9. The method as claimed in claim 1, wherein there are a plurality of first variable resistance memory cells, each of the first variable resistance memory cells being programmed to have one of four different resistance distributions.

10. A method of operating a nonvolatile memory device including first and second variable resistance memory cells including m bit-level cells ("m" is a natural number), the method comprising:
    providing a first program current to the first variable resistance memory cell to program first to m-th data of an input data to the first variable resistance memory cell; and
    providing a second program current to the second variable resistance memory cell to program the (m+1)th to (2m) th data to the second variable resistance memory cell after verifying whether an actual resistance of the programmed first variable resistance memory cell resides in an intended resistance distribution.

11. The method as claimed in claim 10, wherein each of the first and second variable resistance memory cells are programmed to have one of 2m different resistance distributions.

12. The method as claimed in claim 10, wherein verifying the actual resistance of the programmed first variable resistance memory cell includes:
    varying the amount of the first program current until the actual resistance of the programmed first variable resistance is within the intended resistance distribution when the actual resistance of the first variable resistance memory cell does not reside within the intended resistance distribution; and
    providing the varied first program current to the first variable resistance memory cell.

13. The method as claimed in claim 12, wherein providing the second program current is performed when the actual resistance of the first variable resistance memory cell resides within the intended resistance distribution.

14. The method as claimed in claim 10, wherein:
    varying the amount of the first program current includes increasing or decreasing the amount of the first program current in accordance with verification results, and
    increasing or decreasing the amount of the first program current is repeated until the actual resistance of the first variable resistance memory cell is within the intended resistance distribution.

15. The method as claimed in claim 14, wherein a magnitude of change for the varying of the amount of the first program current gradually decreases or increases over a number of iterations.

16. A method of operating a nonvolatile memory device including first and second variable resistance memory cells including m bit-level cells ("m" is a natural number), the method comprising:
    classifying data into even data and odd data;
    writing first even data and first odd data to the first variable resistance memory cell; and
    writing second even data and second odd data to the second variable resistance memory cell after verifying writing of the first even data and the first odd data.

17. The method as claimed in claim 16, wherein:
writing the first even data and the first odd data includes providing a first program current to the first variable resistance memory cell to program the first even data and the first odd data to the first variable resistance memory cell; and writing the second even data and the second odd data includes providing a second program current to the second variable resistance memory cell to program the second even data and the second odd data to the second variable resistance memory cell.

18. The method as claimed in claim 16, wherein verifying writing includes:
comparing actually written data with input data; and
when actually written data differs from the input data by more than a predetermined amount,
   altering writing parameters in accordance with the comparison, and
   writing the first even data and the first odd data to the first variable resistance memory cell using altered writing parameters.

19. The method as claimed in claim 18, wherein, when actually written data differs from the input data by less than the predetermined amount, writing second even data and second odd data to the second variable resistance memory cell.

\* \* \* \* \*